(12) United States Patent
Ercoli

(10) Patent No.: US 10,784,209 B2
(45) Date of Patent: Sep. 22, 2020

(54) ELECTRICAL COMPONENT, DEVICE AND PACKAGE

(71) Applicant: Ampleon Netherlands B.V., Nijmegen (NL)

(72) Inventor: Mariano Ercoli, Nijmegen (NL)

(73) Assignee: Ampleon Netherlands B.V., Nijmegen (NL)

(*) Notice: Subject to any disclaimer, the term of this patent is extended or adjusted under 35 U.S.C. 154(b) by 0 days.

(21) Appl. No.: 16/038,473

(22) Filed: Jul. 18, 2018

(65) Prior Publication Data

US 2019/0027442 A1    Jan. 24, 2019

(30) Foreign Application Priority Data

Jul. 19, 2017  (EP) ..................... 17290095

(51) Int. Cl.
| | |
|---|---|
| *H01L 23/552* | (2006.01) |
| *H01L 23/31* | (2006.01) |
| *H01L 23/495* | (2006.01) |

(52) U.S. Cl.
CPC ........ *H01L 23/552* (2013.01); *H01L 23/3114* (2013.01); *H01L 23/4952* (2013.01); *H01L 23/49503* (2013.01); *H01L 23/49568* (2013.01); *H01L 23/49575* (2013.01); *H01L 2224/49111* (2013.01)

(58) Field of Classification Search
CPC ................................................ H01L 23/49575
See application file for complete search history.

(56) References Cited

U.S. PATENT DOCUMENTS

| | | | |
|---|---|---|---|
| 2003/0127711 A1* | 7/2003 | Kawai ................. | H01L 21/4842 257/666 |
| 2009/0166828 A1 | 7/2009 | Upadhyayula et al. | |
| 2015/0255443 A1 | 9/2015 | Xu et al. | |
| 2015/0270205 A1* | 9/2015 | Tollafield ............. | B23K 1/0016 257/675 |
| 2016/0087588 A1* | 3/2016 | Szymanowski ......... | H01L 23/66 330/307 |
| 2018/0287266 A1* | 10/2018 | Madsen .................. | H01L 24/83 |

FOREIGN PATENT DOCUMENTS

WO    2006/008679 A2    1/2006

OTHER PUBLICATIONS

European Search Report, European Patent Application No. 17290095 dated Dec. 22, 2017, 7 pages.

* cited by examiner

*Primary Examiner* — Alia Sabur
(74) *Attorney, Agent, or Firm* — McDonnell Boehnen Hulbert & Berghoff LLP

(57) ABSTRACT

The present invention relates to an electrical component. The present invention further relates to an electrical device comprising such an electrical component and to a flat no-lead package.
According to the invention, the flat no-lead package comprises a semiconductor die comprising electrical circuitry that has a plurality of terminals for inputting and outputting one or more signals, a thermal pad on which the semiconductor die is mounted, a plurality of leads arranged spaced apart from the thermal pad, and a plurality of further leads that are integrally connected to the thermal pad. One or more terminals among the plurality of terminals are each connected to a respective lead, and one or more terminals among the plurality of terminals are each connected to a respective further lead.

7 Claims, 4 Drawing Sheets

ELECTRICAL COMPONENT, DEVICE AND PACKAGE

CROSS REFERENCE TO RELATED APPLICATIONS

The present application claims priority to European Patent Application EP 17290095.3, filed in the European Patent Office on Jul. 19, 2017, the entirety of which is incorporated herein by reference.

The present invention relates to an electrical component. The present invention further relates to an electrical device comprising such an electrical component and to a package.

Contemporary semiconductor-based electrical components comprise a semiconductor die that is mounted in a given package. Such package typically comprises leads by which the electrical component can be connected to other components such as a printed circuit board. Internally, the leads may be connected to the circuitry that is arranged on the semiconductor die using one or more bondwires. Additional circuitry may be arranged inside the package but outside of the semiconductor die. This latter circuitry may be connected to the circuitry on the semiconductor die and/or to the leads.

A particular type of package, to which aspects of the present invention relate, is the so-called flat no-lead package. Examples of such packages include a quad flat no-lead 'QFN' package, a power quad flat no-lead 'PQFN' package, and a dual flat no-lead 'DFN' package. Flat no-lead packages comprise a thermal pad on which the semiconductor die(s) is/are mounted, and a plurality of leads that are arranged spaced apart from the thermal pad. Sometimes flat no-lead packages are also referred to as micro lead frames (MLF) and small-outline no leads (SON) packages.

Typically, prior to assembly of the package, the leads and thermal pad are supplied in the form of a sheet that comprises the leads and thermal pads for a plurality of packages. The leads and thermal pads are fixed relative to each other using metal strips comprised in the sheet. As a next assembly step, the semiconductor dies and/or other components such as capacitors are mounted on the thermal pads and connections between the leads, the circuitry on the semiconductor die(s) and other components are made, for example by using one or more bondwires. Thereafter, a molding compound is injected to provide protection of the semiconductor dies and other components from the outside. As a final step, the sheet is sawn into a plurality of electrical components. Due to the molding compound, the leads remain fixed relative to the thermal pad.

The molding compound may completely surround the semiconductor die and the other components mounted on the thermal pad essentially without leaving any air inside the package. Alternatively, the molding compound does not directly surround the die and components. In such embodiments, a separate lid is used to cover the die and components. These latter embodiments are known as air-cavity QFN packages.

In some cases, the circuitry arranged in the package may be sensitive to electromagnetic coupling. For example, a first and second circuit may be arranged inside the package, wherein the first circuit comprises a first input terminal, a first output terminal, and one or more signal processing elements for processing a signal received at the first input terminal and for supplying the processed signal at the first output terminal. The second circuit may comprise a second input terminal, a second output terminal, and one or more signal processing elements for processing a signal received at the second input terminal and for supplying the processed signal at the second output terminal.

To prevent crosstalk between these two circuits, electrical isolation is required. To address this need, it is known to arrange metal structures in between the two circuits on the semiconductor die and/or to mount bondwires that span across the semiconductor die, both alternatives trying to mimic an isolation wall. However, for highly sensitive applications, the isolation provided by the known isolation wall is considered too low.

An object of the present invention is to provide a solution for this problem. According to a first aspect, this object is achieved with the electrical component as defined in claim 1 which is characterized in that the flat no-lead package comprises a plurality of further leads that are integrally connected to the thermal pad and in that the electrical isolation comprises a first terminal and a second terminal of which at least one is connected to a respective further lead.

Because the further leads are connected inside the package to the thermal pad, which is normally grounded, a higher isolation between the first and second circuits can be achieved. Moreover, by arranging a further lead adjacent to a signal carrying lead, the inductance associated with that latter lead can be reduced. For example, if a lead is connected using one or more bondwires to a gate terminal of a transistor that is arranged on the semiconductor die, the source inductance of that transistor, which is commonly associated with the radiofrequency (RF) return current distribution, can be lowered due to the impact the further lead has on this return current. Because the electrical isolation is normally connected to the further leads using one or more bondwires, the isolation between leads can be improved if a further lead is arranged between them.

In an embodiment, the first and second circuits are arranged on the same semiconductor die and the electrical isolation is arranged on this semiconductor die in between the first and second circuits. In an alternative embodiment, the first and second circuits are arranged on separate semiconductor dies that are mounted on the thermal pad, and the electrical isolation is arranged on the thermal pad or is at least partially formed by the thermal pad. For example, the electrical isolation could be formed by a small section of the thermal pad. The ends of these sections then form the first and second isolation terminals. At least one of those terminals is connected to a respective further lead, for example by using one or more bondwires.

The thermal pad may comprise a flat central part and laterally extending further tabs that protrude from the central part, wherein each further tab forms a respective further lead. These further tabs may protrude into a corner or side region of the package and/or into a region in between a pair of leads. Each lead may be formed by a respective tab that is spaced apart from other tabs. Moreover, the tabs, the further tabs, and the thermal pad may all extend in substantially the same plane.

The lead that is connected to the first input terminal and the lead that is connected to the second input terminal may be separated by a further lead that is connected to the first isolation terminal. Additionally or alternatively, the lead that is connected to the first output terminal and the lead that is connected to the second output terminal may be separated by a further lead that is connected to the second isolation terminal.

At least one, but preferably all, of the leads that is/are connected to the first input terminal, the first output terminal, the second input terminal, or the second output terminal, is/are arranged, on either side thereof, directly adjacent to a further lead.

The electric isolation may comprise a metal track arranged on the semiconductor die that extends between the first and second isolation terminals Additionally or alternatively, the electric isolation may comprise one or more bondwires that extend between the first and second isolation terminals. Hence, in an embodiment, one or more bondwires extend between a further lead and the first isolation terminal, between the first isolation terminal and the second isolation terminal, and between the second isolation terminal and a further lead. This series connection of isolation elements is preferably arranged along a straight line.

The first input terminal, the second input terminal, and the first isolation terminal may be arranged on a first side of the semiconductor die, and the first output terminal, the second output terminal, and the second isolation terminal may be arranged on a second side of the semiconductor die other than the first side, wherein the first and second sides are preferably opposing sides.

Additionally or alternatively, the first input terminal may be arranged opposite to the first output terminal, and/or the second input terminal may be arranged opposite to the second output terminal, and/or the first isolation terminal may be arranged opposite to the second isolation terminal.

The first input terminal, the first output terminal, the second input terminal, the second output terminal, the first isolation terminal and/or the second isolation terminal may be connected to the corresponding leads or further leads using one or more bondwires.

The one or more signal processing elements of the first and second circuit may comprise at least one element of the group consisting of a power amplifiers, a low-noise amplifier, a phase shifter, a phase-locked loop, a mixer, and an oscillator, wherein the signal processing elements are preferably configured to have an operational frequency within the frequency range from 500 MHz to 100 GHz. As an example, the first and second circuit may comprise separate power amplifiers operating up to 100 W. In another embodiment, the first and second circuits comprise the peak amplifier and main amplifier of a Doherty amplifier, respectively. Here it is noted that the invention is not limited to a particular kind of semiconductor technology and may equally relate to Gallium Nitride (GaN) technology, such as GaN FETs, Silicon technology (Si), such as Silicon laterally diffused metal-oxide-semiconductor (LDMOS) transistors, Gallium Arsenide (GaAs) technology, such as GaAs FETs, or Silicon Germanium (SiGe) technology.

According to a second aspect, the invention provides an electrical device that comprises the electrical component as defined above and a printed circuit board that comprises a land pattern for placement of the electrical component, wherein the land pattern comprises a thermal pad and a plurality of terminal pads. The electrical component is mounted on the land pattern such that the thermal pad of the electrical component contacts the thermal pad of the land pattern and such that the leads and further leads of the electrical component each contact a respective terminal pad. The terminal pads that are connected to the further leads are preferably grounded using a via hole through the printed circuit board down to a ground layer. The same holds for the thermal pad of the land pattern.

According to a further aspect, the present invention provides a flat no-lead package, such as a quad flat no-lead 'QFN' package, a power quad flat no-lead 'PQFN' package, or a dual flat no-lead 'DFN' package, comprising a semiconductor die comprising electrical circuitry that has a plurality of terminals for inputting and outputting one or more signals, a thermal pad on which the semiconductor die is mounted, a plurality of leads arranged spaced apart from the thermal pad, and a plurality of further leads that are integrally connected to the thermal pad. According to the invention, one or more terminals among the plurality of terminals are each connected to a respective lead, and one or more terminals are each connected to a respective further lead.

The thermal pad may comprise a flat central part and laterally extending further tabs that protrude from the central part, each further tab forming a respective further lead. The further tabs preferably protrude into a corner or side region of the package and/or into a region in between a pair of leads. These leads are each preferably formed by a respective tab that is spaced apart from other tabs. The tabs, the further tabs, and the thermal pad all preferably extend substantially in the same plane.

The package may be obtained by supplying a molding compound to the leads, the further leads, and the thermal pad after having arranged the semiconductor die on the thermal pad. A side of the thermal pad opposite to the side on which the semiconductor die is mounted has preferably been etched prior to applying the molding compound such that a clearance between the leads and the thermal pad is increased and such that the connection between the thermal pad and the further leads is only partially etched. The void left by the partially etching is filled up by the molding compound. In this manner, the bottom side of the package can be consistently formed for the purpose of soldering the package to a printed circuit board, regardless of the amount of further leads that are connected to the thermal pad. Without the partial etch, the amount of metal exposed on the back side of the package may differ depending on the amount of further leads. This may pose problems when using these packages in mass production.

Next, the invention is described referring to the appended drawings, wherein.

Figure 1:
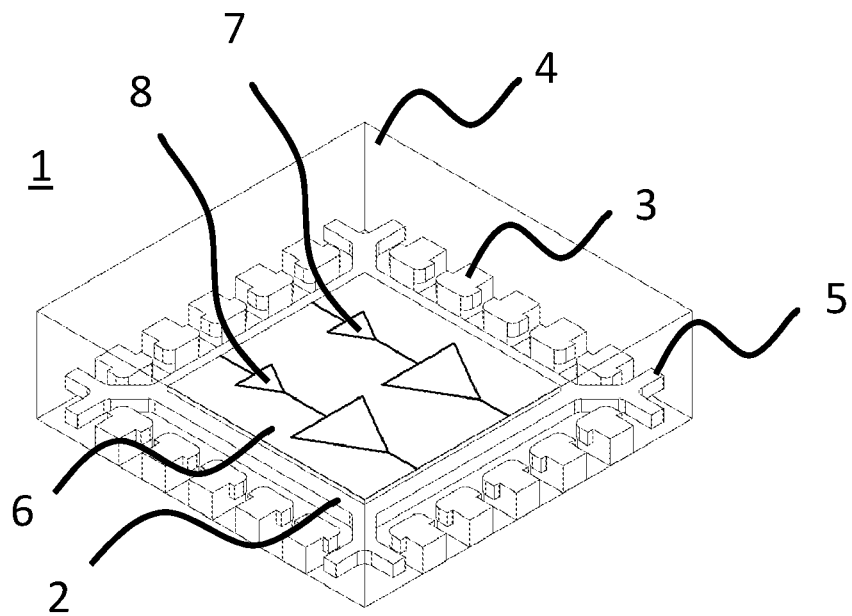
FIG. 1 illustrates a top view of a known PQFN package.

FIG. 1 illustrates a known PQFN package 1. This package comprises a thermal pad 2 and a plurality of leads 3 that are fixed relative to each other and to thermal pad 2 by a solidified molding compound 4. In FIG. 1, molding compound 4 completely surrounds the components in the package, thereby minimizing the air in the package. In alternative embodiments, an air cavity is created in the package. In these cases, the package comprises a lid, optionally from the same molding compound as the compound that was used for fixing the thermal pad and leads. These latter packages are known as air-cavity QFN packages. It is noted that the present invention relates to either type.

On the corners, thermal pad 2 is provided with extrusions 5, which are typically not used electrically. These elements kept thermal pad 2 attached to a metal strip during manufacturing of the package. This same strip is connected to leads 3 during manufacturing. After manufacturing the package, individual packages are sawn from the metal strip thereby severing the connection between thermal pad 2, leads 3 and the metal strip. Thereafter, thermal pad 2 and leads 3 are mutually fixed using solidified molding compound 4.

FIG. 1 illustrates a semiconductor die 6 that is mounted on thermal pad 2. Semiconductor die 6 comprises a first circuit 7 and a second circuit 8, which are schematically shown, and which are electrically coupled to leads 3 using bondwires (not shown).

Figure 2:
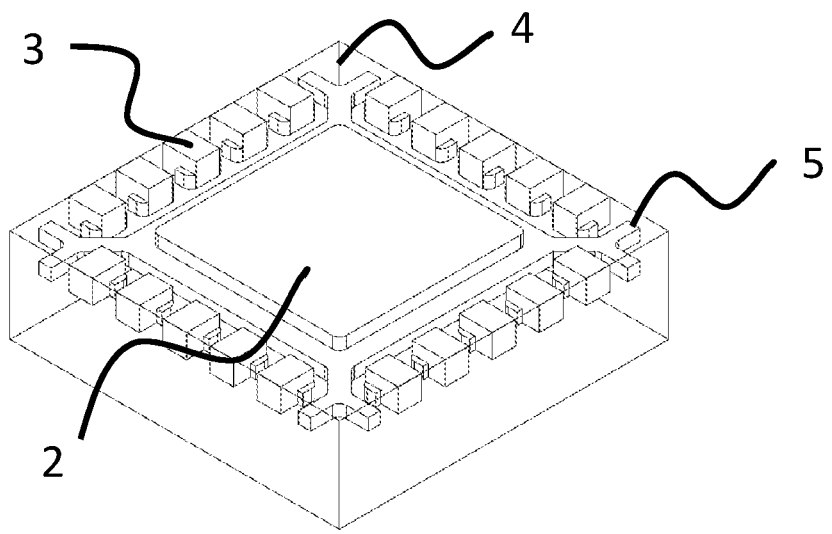
FIG. 2 illustrates a bottom view of the PQFN package shown in FIG. 1.

FIG. 2 illustrates a bottom view of the PQFN package shown in FIG. 1. Both leads 3 and thermal pad 4 comprise a metal stack consisting of multiple metal layers of which the bottom layer(s) have at least been partially etched. The resulting space is filled up by molding compound 4 thereby resulting in a package with a substantially flat backside. In most cases, a minimum clearance needs to be observed between leads 3 and thermal pad 2 in view of solderability of the package.

In some cases it is important to have a proper isolation between first circuit 7 and second circuit 8. In prior art solutions, a metal track is arranged on semiconductor die 6 in between circuits 7 and 8. The metal track may be connected, on opposing sides, to respective leads 3 using bondwires. These leads may then in turn be connected to ground on the printed circuit board on which package 1 is mounted.

The applicant has found that the electrical isolation between circuits 7 and 8 may be inadequate for some applications. A solution to this problem can be found in FIG. 3, which illustrates an embodiment of a PQFN package 10 in accordance with the present invention. The main difference with PQFN package 1 of FIG. 1 is that some of the leads are electrically connected to thermal pad 2. More in particular, the connection between these leads, hereinafter referred to as further leads 3', is an integral connection.

Figure 3:
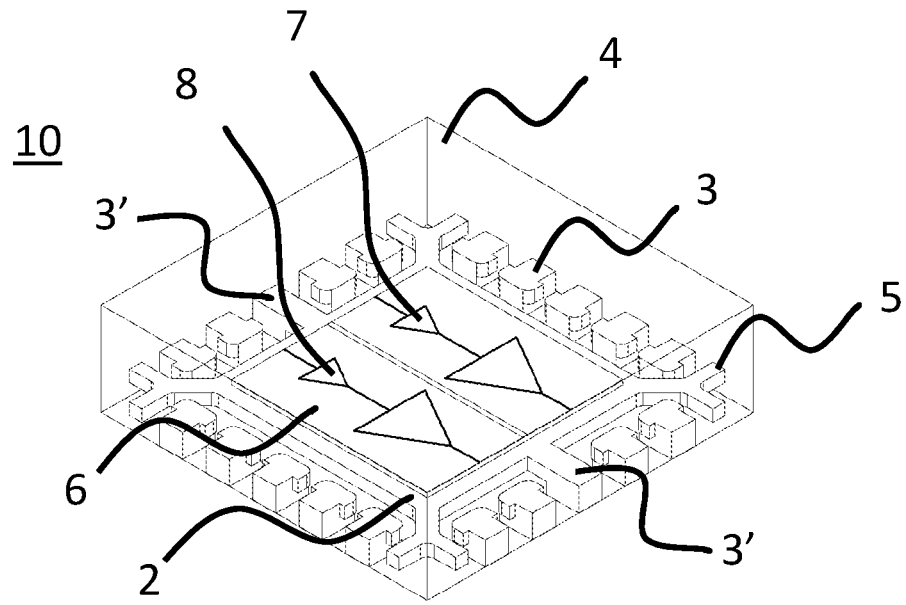
FIG. 3 illustrates a top view of an embodiment of a PQFN package in accordance with the present invention.
Figure 4:
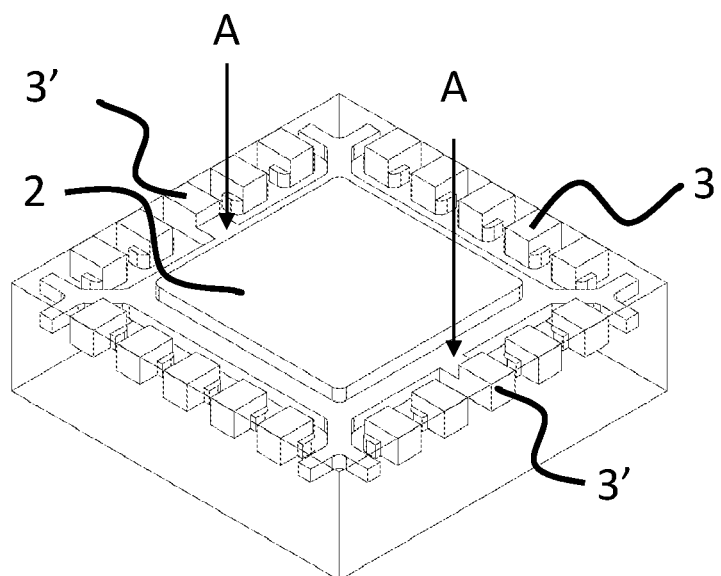
FIG. 4 illustrates a bottom view of the PQFN package shown in FIG. 3.

The backside of package 10 is shown in FIG. 4. As can be seen, at the position indicated by arrows A, the metal in between further leads 3' and thermal pad 2 has been partially etched away prior to the molding. The void left by this partial etching is then, in a later stage, filled by the molding compound. As a result, the footprint of package 10 is substantially identical to the footprint of package 1. The land pattern of the printed circuit board does therefore not require a modification when changing between packages in accordance with FIG. 1 or 3.

FIGS. 5A-5D illustrate a plurality of different embodiments that each employ the further leads 3' of the embodiment shown in FIG. 3.

Figure 5A:
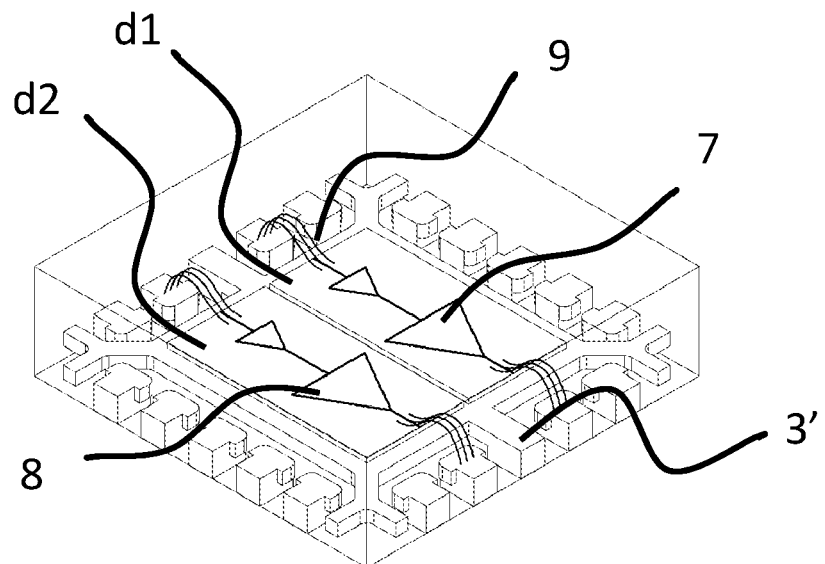
FIGS. 5A-5D illustrate further embodiments of a PQFN package in accordance with the present invention.

FIG. 5A illustrates an embodiment wherein two semiconductor dies d1 and d2 are mounted on thermal pad 2. Each die comprises a electrical circuit 7, 8 that is connected to a respective input or output lead using bondwires 9. A further lead 3' is arranged in between the input leads and output leads of circuits 7 and 8.

Figure 5B:
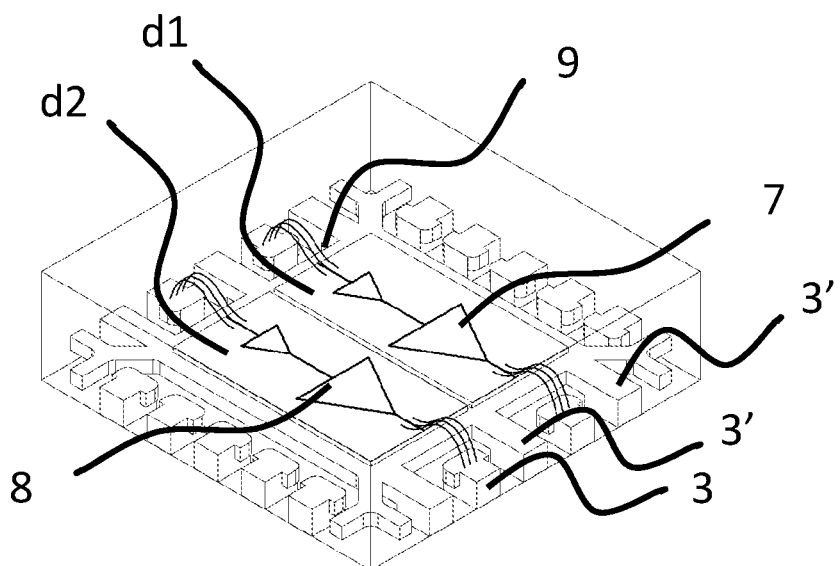

Compared to FIG. 5A, the embodiment in FIG. 5B comprises a further lead 3' on either side of the input and output leads.

In FIGS. 5A and 5B the electrical isolation between circuits 7, 8 is formed by the section of thermal pad 2 that is arranged between dies d1, d2 and which extends between further leads 3'.

Figure 5C:
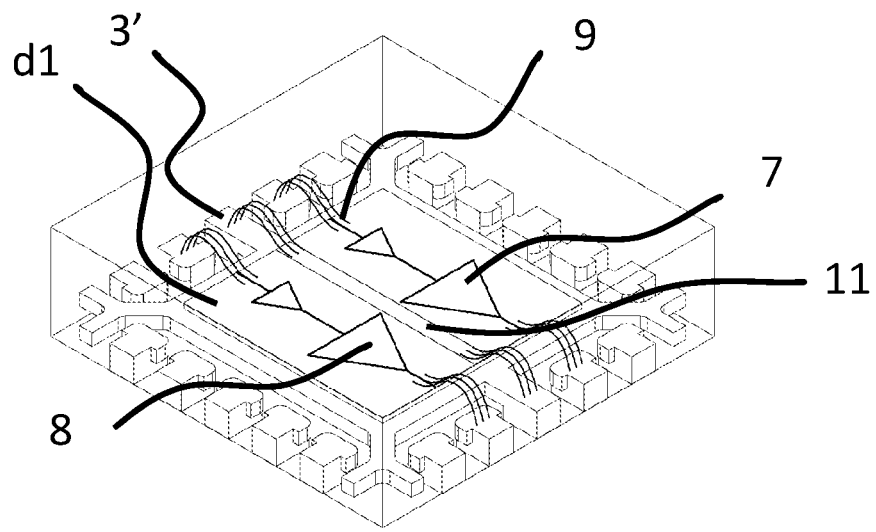

FIG. 5C illustrates an embodiment wherein a single semiconductor dies d1 is mounted on thermal pad 2. Die d1 comprises circuits 7 and 8 that are each connected to a respective input or output lead using bondwires 9. A further lead 3' is arranged in between the input leads and output leads of circuitry 7 and 8. Compared to FIG. 5A, the embodiment in FIG. 5C comprises a metal track 11 arranged on die d1. This track is connected using bondwires 9 to further leads 3'.

Figure 5D:
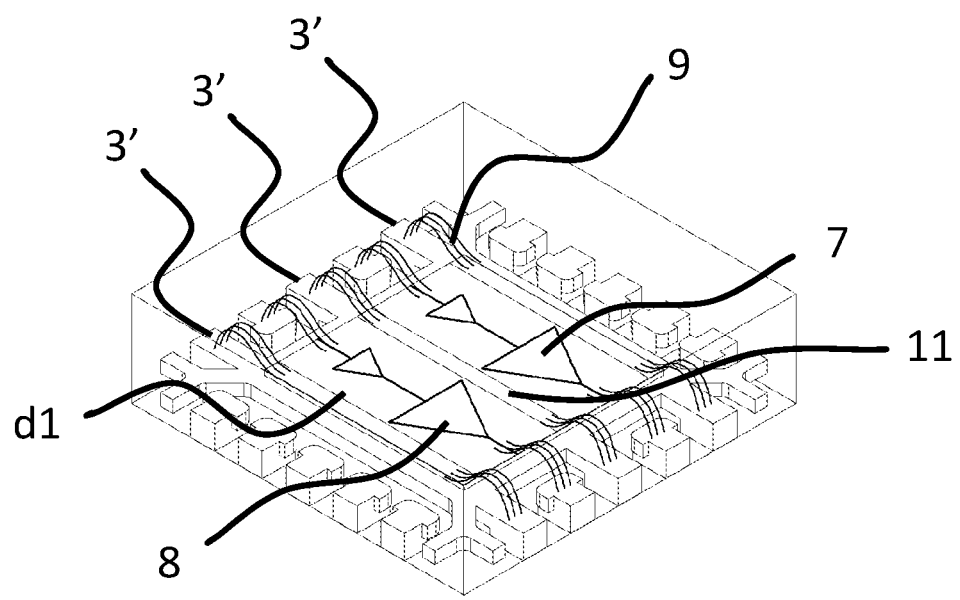

Compared to FIG. 5C, the embodiment in FIG. 5D comprises three metal tracks arranged on die d1. Each of these tracks is connected to a further lead 3' using bondwires 9. Moreover, similar to the embodiment in FIG. 5B, each input and output lead is arranged in between a pair of further leads 3'.

For each embodiment illustrated in FIGS. 5A-5D, the footprint is identical and as shown in 4.

If a given input or output lead is arranged in between a pair of further leads a more effective electromagnetic shielding can be obtained when compared to known approaches wherein the leads adjacent to the input or output lead are connected to ground only via the printed circuited board they are mounted on. Furthermore, the metal in between further leads 3' and thermal pad 2 acts as a metal shield in addition to the bondwires that may extend between further leads 3' and the isolation terminals of the electrical isolation when the electrical isolation is arranged on the semiconductor die.

Although the invention has been explained by detailed embodiments thereof, the invention is not limited to these embodiments. Instead, the scope of protection of the invention is defined by the claims and their equivalents.

The invention claimed is:
1. An electrical component, comprising:
   a semiconductor die;
   a power quad flat no-lead (PQFN) package comprising:
      a thermal pad on which the semiconductor die is mounted;
      a plurality of leads arranged spaced apart from the thermal pad;
   a first circuit arranged inside the (PQFN) package and comprising a first input terminal, a first output terminal, and one or more signal processing elements for processing a signal received at the first input terminal and for supplying the processed signal at the first output terminal;
   a second circuit arranged inside the (PQFN) package and comprising a second input terminal, a second output terminal, and one or more signal processing elements for processing a signal received at the second input terminal and for supplying the processed signal at the second output terminal; and
   an electrical isolation configured for providing electrical isolation between the first and second circuits;
   wherein the first and second circuits are arranged on the semiconductor die and wherein the electrical isolation is arranged on the semiconductor die in between the first and second circuits;
   wherein the first input terminal, the second input terminal, the first output terminal, and the second output terminal are each connected to a respective lead;
   wherein the first and second circuits comprise a peak amplifier and a main amplifier of a Doherty amplifier, respectively, wherein the first and second circuits are realized using Gallium Nitride (GaN) FETs, or Silicon laterally diffused metal-oxide-semiconductor (LDMOS) transistors;
   wherein the (PQFN) package comprises a plurality of further leads that are integrally connected to the thermal pad, and the electrical isolation comprises a first and second isolation terminal of which at least one is connected to a respective further lead;

wherein the electrical isolation comprises a metal track arranged on the semiconductor die that extends between the first and second isolation terminals, or wherein the electrical isolation comprises one or more bondwires that extend between the first and second isolation terminals;

wherein the first input terminal, the second input terminal, and the first isolation terminal are arranged on a first side of the semiconductor die, and wherein the first output terminal, the second output terminal, and the second isolation terminal are arranged on a second side of the semiconductor die other than the first side, wherein the first and second sides are opposing sides;

and wherein the PFQN package is obtained by supplying a molding compound to the leads, the further leads, and thermal pad after having arranged the semiconductor die on the thermal pad, wherein a side of the thermal pad opposite to the side on which the semiconductor die is mounted has been etched prior to applying the molding compound such that a clearance between the surfaces of the leads that are exposed on a backside of the (PQFN) package and the surface of the thermal pad that is exposed on the backside of the (PQFN) package is increased and such that the connection between the thermal pad and the further lead is only partially etched, the void left by the partial etch being filled up by the molding compound.

2. The electrical component according to claim 1, wherein the thermal pad comprises a flat central part and laterally extending further tabs that protrude from the central part, each further tab forming a respective further lead, wherein the further tabs protrude into a corner or side region of the (PQFN) package and/or into a region in between a pair of leads.

3. The electrical component according to claim 2, wherein the leads are each formed by a respective tab that is spaced apart from other tabs, and wherein the tabs, the further tabs, and the thermal pad all extend substantially in the same plane.

4. The electrical component according to claim 1, wherein the lead that is connected to the first input terminal and the lead that is connected to the second input terminal are both arranged directly adjacent to the further lead that is connected to the first isolation terminal; and wherein the lead that is connected to the first output terminal and the lead that is connected to the second output terminal are both arranged directly adjacent to the further lead that is connected to the second isolation terminal;

wherein the first input terminal, the first output terminal, the second input terminal, the second output terminal, the first isolation terminal and the second isolation terminal are connected to the corresponding leads or further leads using one or more bondwires.

5. The electrical component according to claim 1, wherein all of the leads that are connected to the first input terminal, the first output terminal, the second input terminal, or the second output terminal, are arranged, on either side thereof, directly adjacent to a further lead.

6. The electrical component according to claim 1, wherein the leads, further leads, and thermal pad comprise a metal stack consisting of multiple metal layers of which the bottom layer(s) have at least been partially etched.

7. An electrical device, comprising:
an electrical component comprising:
a semiconductor die;
a power quad flat no-lead (PQFN) package comprising:
a thermal pad on which the semiconductor die is mounted;
a plurality of leads arranged spaced apart from the thermal pad;
a first circuit arranged inside the (PQFN) package and comprising a first input terminal, a first output terminal, and one or more signal processing elements for processing a signal received at the first input terminal and for supplying the processed signal at the first output terminal;
a second circuit arranged inside the (PQFN) package and comprising a second input terminal, a second output terminal, and one or more signal processing elements for processing a signal received at the second input terminal and for supplying the processed signal at the second output terminal; and
an electrical isolation configured for providing electrical isolation between the first and second circuits;
wherein the first and second circuits are arranged on the semiconductor die and wherein the electrical isolation is arranged on the semiconductor die in between the first and second circuits;
wherein the first input terminal, the second input terminal, the first output terminal, and the second output terminal are each connected to a respective lead;
wherein the first and second circuits comprise a peak amplifier and a main amplifier of a Doherty amplifier, respectively, wherein the first and second circuits are realized using Gallium Nitride (GaN) FETs, or Silicon laterally diffused metal-oxide-semiconductor (LDMOS) transistors;
wherein the (PQFN) package comprises a plurality of further leads that are integrally connected to the thermal pad, and the electrical isolation comprises a first and second isolation terminal of which at least one is connected to a respective further lead;
wherein the electrical isolation comprises a metal track arranged on the semiconductor die that extends between the first and second isolation terminals, or wherein the electrical isolation comprises one or more bondwires that extend between the first and second isolation terminals;
wherein the first input terminal, the second input terminal, and the first isolation terminal are arranged on a first side of the semiconductor die, and wherein the first output terminal, the second output terminal, and the second isolation terminal are arranged on a second side of the semiconductor die other than the first side, wherein the first and second sides are opposing sides;
and wherein the PFQN package is obtained by supplying a molding compound to the leads, the further leads, and thermal pad after having arranged the semiconductor die on the thermal pad, wherein a side of the thermal pad opposite to the side on which the semiconductor die is mounted has been etched prior to applying the molding compound such that a clearance between the surfaces of the leads that are exposed on a backside of the (PQFN) package and the surface of the thermal pad that is exposed on the backside of the (PQFN) package is increased and such that the connection between the thermal pad and the further lead is only partially etched, the void left by the partial etch being filled up by the molding compound; and a printed circuit board comprising a land pattern for placement of the electrical component, wherein the land pattern comprises a thermal pad and a plurality of terminal pads;

wherein the electrical component is mounted on the land pattern such that the thermal pad of the electrical component contacts the thermal pad of the land pattern and such that the leads and further leads of the electrical component each contact a respective terminal pad;

wherein the thermal pad of the land pattern is electrically grounded.

\* \* \* \* \*